United States Patent [19]
Morita et al.

[11] Patent Number: 5,414,297
[45] Date of Patent: * May 9, 1995

[54] SEMICONDUCTOR DEVICE CHIP WITH INTERLAYER INSULATING FILM COVERING THE SCRIBE LINES

[75] Inventors: Naoyuki Morita; Hiroaki Tsugane, both of Naganoken, Japan

[73] Assignee: Seiko Epson Corporation, Tokyo, Japan

[*] Notice: The portion of the term of this patent subsequent to Aug. 4, 2009 has been disclaimed.

[21] Appl. No.: 103,640

[22] Filed: Aug. 11, 1993

Related U.S. Application Data

[60] Continuation-in-part of Ser. No. 850,826, Mar. 13, 1992, Pat. No. 5,237,199, which is a division of Ser. No. 508,848, Apr. 12, 1990, Pat. No. 5,136,354.

[30] Foreign Application Priority Data

Apr. 13, 1989 [JP] Japan ................................... 1-94124
May 18, 1989 [JP] Japan ................................. 1-124741
Jan. 8, 1990 [JP] Japan ......................................... 2-432

[51] Int. Cl.[6] ................... H01L 27/02; H01L 21/302; H01L 29/34
[52] U.S. Cl. ..................................... 257/620; 257/506; 257/503; 257/638; 257/797; 437/226; 437/234
[58] Field of Search ............... 257/503, 638, 758, 797, 257/506, 620; 437/226, 234

[56] References Cited

U.S. PATENT DOCUMENTS

| | | | |
|---|---|---|---|
| 3,852,876 | 12/1974 | Sheldon et al. | 437/227 |
| 4,080,621 | 3/1978 | Funakawa et al. | 257/620 |
| 4,259,682 | 3/1981 | Gamo | 437/226 |
| 4,364,078 | 12/1982 | Smith et al. | 257/620 |
| 4,835,592 | 5/1989 | Zommer | 257/620 |
| 4,925,808 | 5/1990 | Richardson | 437/227 |

FOREIGN PATENT DOCUMENTS

57-90975 6/1982 Japan ................................... 257/638

*Primary Examiner*—Mahshid D. Saadat
*Attorney, Agent, or Firm*—Spensley Horn Jubas & Lubitz

[57] ABSTRACT

An integrated circuit wafer composed of a substrate having a surface carrying a plurality of circuit chips spaced from one another by scribe lines constituted by regions of the substrate surface along which the substrate will be cut in order to separate the chips from one another, each chip having at least one semiconductor element composed of a plurality of patterned layers of electrically conductive material and the wafer further including at least one interlayer insulation film having portions which extend across each chip and interposed between two of the layers of electrically conductive material to form a component part of each element, the interlayer insulation film further having portions which extend across the scribe lines at the time the substrate is cut along the scribe lines and which are contiguous with portions of the interlayer insulation film that extend across each chip, wherein the wafer is provided with one or more defined patterns located at at least one scribe line region and a passivation film covering the chips and the at least one scribe line region, and each defined pattern is constituted by one of: an observable irregularity in the wafer surface; a film portion of insulating material; or a film portion of electrically conductive material. A strip of electrically conductive material may be disposed in a groove in the interlayer insulation film along each longitudinal edge of each scribe line.

33 Claims, 10 Drawing Sheets

SEMICONDUCTOR DEVICE CHIP WITH INTERLAYER INSULATING FILM COVERING THE SCRIBE LINES

CROSS-REFERENCE TO RELATED APPLICATIONS

This application is a continuation-in-part of application Ser. No. 07/850,826, filed Mar. 13, 1992, now U.S. Pat. No. 5,237,199, which is a division of application Ser. No. 07/508,848 filed Apr. 12, 1990, now U.S. Pat. No. 5,136,354.

BACKGROUND OF THE INVENTION

1. Field of the Invention

The present invention relates to a semiconductor device wafer and, more particularly, to the wafer regions constituting scribe lines.

2. Description of the Prior Art

In the art of fabricating semiconductor devices, when the interlayer insulation films formed between wiring regions on a semiconductor substrate by CVD are subjected to a predetermined processing involving a fine processing technique, all the interlayer films on the scribe lines are removed. Similarly, when wiring films formed by sputtering are processed, all the wiring films on the scribe lines are removed. As a result, when the structure of the device has been completed, the semiconductor substrate is generally exposed along the scribe lines to remove all the films which were sequentially formed in the process of fabricating the semiconductor device.

Figure 2:
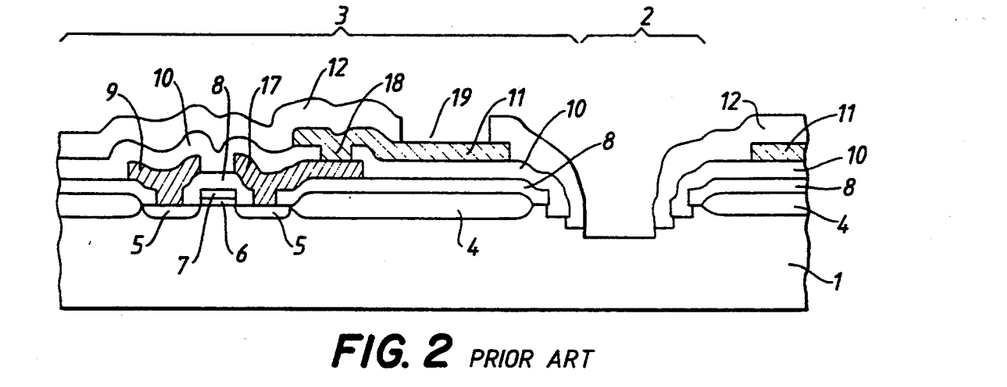
FIG. 2 is a cross-sectional view of a chip and a scribe line area of a conventional semiconductor device.

For example, FIG. 2 is a schematic sectional view of the structure of a chip and a scribe line in a conventional MOS-type semiconductor device having one layer of gate wiring and two layers of metal wiring.

In FIG. 2, the reference numeral 1 represents a semiconductor substrate, 2 a scribe line, 3 a part of a chip and 4 a LOCOS film constituting a device isolation region. The chip 3, namely a semiconductor device, is composed of a source and a drain 5 formed in the semiconductor substrate 1, a gate insulating film 6 formed on the semiconductor substrate 1 and a gate electrode layer 7 formed thereon. As is clear from FIG. 2, the scribe line area is in the form of a deep groove with the surface of the semiconductor substrate 1 exposed along the scribe line 2 and with the gate electrode layer 7, interlayer insulation films 8, 10 and metal wiring 9, 11 removed. This is because in fabricating a general semiconductor device, the surface of the semiconductor substrate 1 is constantly exposed on the scribe line while the interlayer insulation films and the metal wirings are formed on the semiconductor substrate 1 in the chip area. The difference in height between the surface of the semiconductor chip 3 and the surface of the scribe line 2 increases as the fabricating steps proceed. The interlayer insulation film 8 is formed between the gate electrode wiring 7 and the first metal wiring 9, and interlayer insulation film 10 is formed between the first metal wiring 9 and the second metal wiring 11.

The reference numeral 17 identifies one of the contact holes for bringing the source and drain 5 and the first metal wiring 9 into contact with each other. The reference 18 is a contact hole for bringing the first metal wiring 9 and the second metal wiring 11 into contact with each other. The reference numeral 19 denotes a bonding pad.

As described above, in order to prevent various mechanical strains, due to machining for scribing, or dicing, the semiconductor device to produce chips, from exerting a deleterious influence in the chips, the semiconductor substrate 1 is exposed on the scribe line 2 such that the scribe line area is formed as a deep groove.

A drawback of the above-described conventional semiconductor device, however, is that formation of the scribe line requires a complicated process. That is, the steps of removing the film which was laminated on the scribe line simultaneously with the formation of the wiring film, the interlayer insulation film, a passivation film, and the like are required every time each film is formed on the semiconductor substrate in the chip areas.

The concrete problem in the manufacturing process will be explained in the following with reference to the accompanying drawings.

Figure 3:
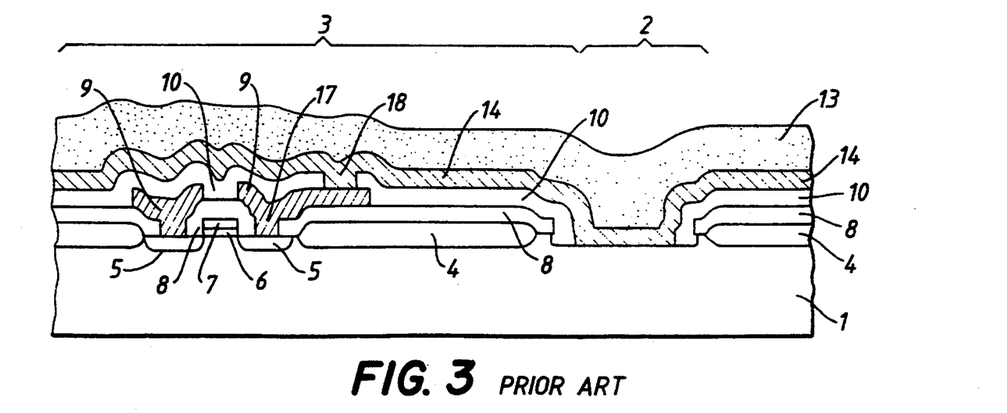
FIGS. 3, 4, 5 and 6 are cross-sectional views of the processing steps of a conventional semiconductor device.

FIG. 3 is a sectional view of a semiconductor device during a fine processing step. After a metal wiring film 14 is formed on the interlayer insulation film 10 by sputtering, a resist film 13 is applied to the metal wiring film 14 so as to form the metal wiring 11. As is obvious from FIG. 3, the thickness of the resist film 13 on the chip 3 is different from the thickness of the resist film 13 on the scribe line 2; the resist film on the scribe line 2 is relatively thick. This is because when a resist is applied to an uneven surface of a semiconductor wafer by spin coating, the resist film generally becomes thin at protruding portions and thick at recessed portions in comparison with the case of applying a resist to a flat wafer surface. In the structure of a conventional semiconductor device in which all the films on the scribe line 2 are removed, since the groove along the scribe line 2 is deeper than recessed portions in the chip 3, the thickness of the resist film becomes especially large on the scribe line 2.

For the purpose of patterning the resist film, the resist film is appropriately exposed by an exposing apparatus so as to form a predetermined resist pattern. It is generally known that the exposure necessary for obtaining a predetermined resist pattern increases with the thickness of the resist film. There are two kinds of resists, namely, a positive type resist and a negative type resist. A positive type resist is generally used for fine processing. The following explanation relates to a positive type resist. Since the thickness of the resist film becomes especially large on the scribe line 2, an exposure appropriate for the chip 3 is insufficient for the scribe line 2, thereby leaving some part of the resist film unexposed.

Figure 4:
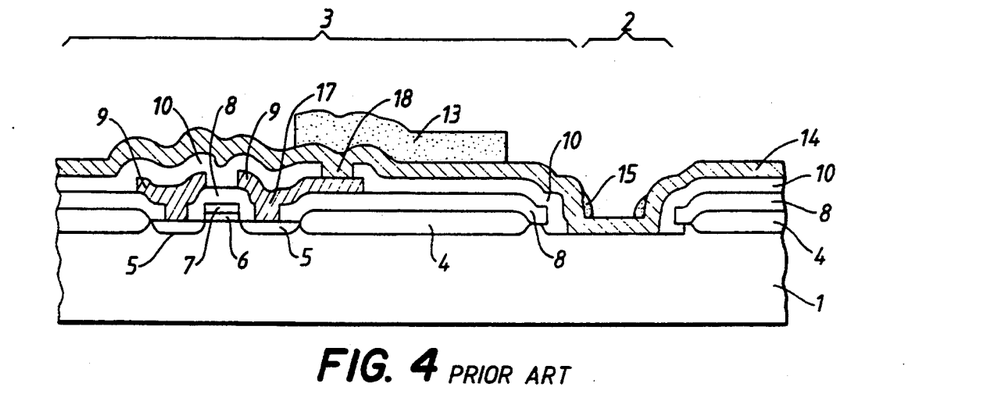
Figure 5:
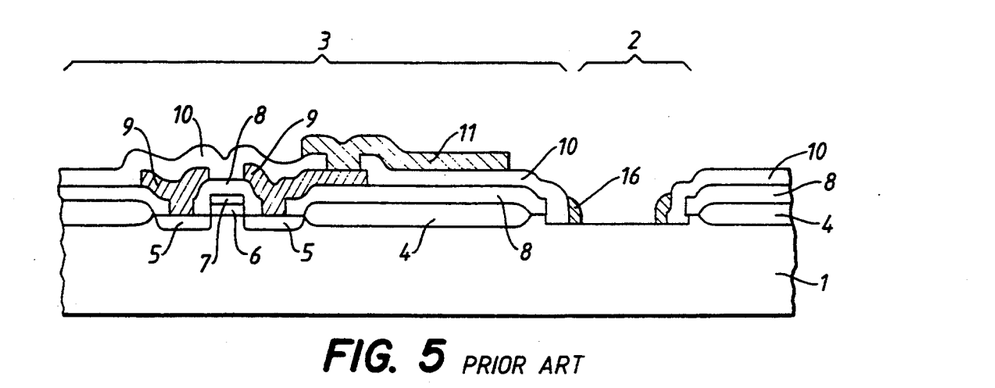

FIG. 4 is a sectional view of the semiconductor device shown in FIG. 3 after resist film 13 is patterned. As is clear from FIG. 4, unexposed resist film areas 15 remain on the side walls of the groove on the scribe line 2. The metal wiring 11 is next formed while using the resist pattern 13 as a mask. The unexposed resist film 15 also works as a mask, and a narrow partial metal wiring film 16 remains on the side wall of the groove on the scribe line 2, as shown in FIG. 5, after the unexposed resist film is removed. The narrow partial metal wiring film 16 easily slips off during an after-treatment step such as the step of removing the resist pattern after the etching of the metal wiring film 14, and parts of the separated metal wiring film 16 can then adhere onto the surface of a chip 3, thereby disadvantageously lowering chip yield and quality. This occurs because the narrow partial metal wiring film 16 tends to behave like fine dust.

Figure 6:
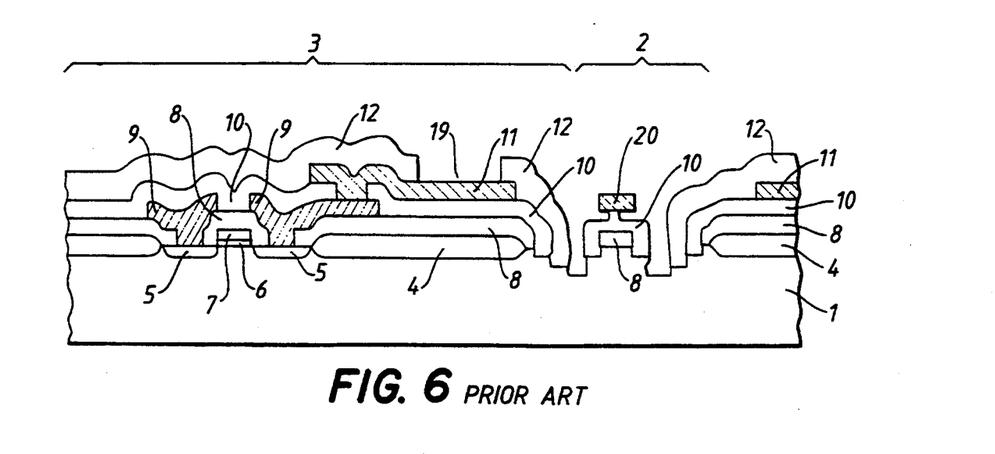

Various marks necessary at the time of fabrication, such as an alignment mark for an exposing apparatus, are generally placed on the scribe line. FIG. 6 is a sectional view of a semiconductor device in the state after the steps for forming an alignment mark 20 for an exposing apparatus from the metal wiring film 11 and removing a passivation film from the bonding pad 19. As is obvious from FIG. 6, an undercut etching is performed on the interlayer insulation film 10 right under alignment mark 20. This is produced because the scribe line area 2 is simultaneously etched when the passivation film 12 is etched. The alignment mark 20 with the undercut etching produced in this way easily slips off of film 10, during etching or in an after-treatment step after etching, thereby producing a problem similar to that above with reference to film 16 in FIG. 5.

SUMMARY OF THE INVENTION

Accordingly, it is an object of the present invention to eliminate the above-described problems in the prior art and to provide a semiconductor device which allows easy dicing by scribing in order to form chips and which has a stable yield, a high resistance to moisture and a high quality at a low cost.

The above and other objects are achieved, according to the invention, by the provision of an integrated circuit wafer composed of a substrate having a surface carrying a plurality of circuit chips spaced from one another by scribe lines constituted by regions of the substrate surface along which the substrate will be cut in order to separate the chips from one another, each chip having at least one semiconductor element composed of a plurality of patterned layers of electrically conductive material and the wafer further including at least one interlayer insulation film having portions which extend across each chip and interposed between two of the layers of electrically conductive material to form a component part of each element, the interlayer insulation film further having portions which extend across the scribe lines at the time the substrate is cut along the scribe lines and which are contiguous with portions of the interlayer insulation film that extend across each chip, wherein the wafer is provided with one or more defined patterns located at at least one scribe line region and a passivation film covering the chips and the at least one scribe line region, and each defined pattern is constituted by one of: an observable irregularity in the wafer surface; a film portion of insulating material; or a film portion of electrically conductive material.

In further accordance with the invention, an interlayer insulation film may be provided with a hole in which part of a film portion of electrically conductive material is disposed.

Further, a film or layer of insulating material may be interposed between the wafer surface and the interlayer insulation film across each scribe line.

Objects according to the invention are further achieved by the provision an integrated circuit wafer composed of a substrate having a surface carrying a plurality of circuit chips spaced from one another by scribe lines constituted by regions of the substrate surface along which the substrate will be cut in order to separate the chips from one another, each scribe line having two longitudinal edges and a central portion between the longitudinal edges, wherein each chip has at least one semiconductor element composed of a plurality of patterned layers of electrically conductive material and the wafer further includes at least one interlayer insulation film having portions which extend across each chip and interposed between two of the layers of electrically conductive material to form a component part of each element, the interlayer insulation film further having portions which each extend across the central portion of a respective scribe line at the time the substrate is cut along the scribe lines and the interlayer insulation film further having a groove extending along each longitudinal edge for separating the portions of the interlayer insulation film which extend across the central portions of the scribe lines from portions of the interlayer insulation film that extend across each chip, wherein the wafer further includes a strip of electrically conductive material filling each groove and extending over a region of the interlayer insulation film adjacent each groove.

The above and other objects, features and advantages of the present invention will become clear from the following description of the preferred embodiments thereof, taken in conjunction with the accompanying drawings.

BRIEF DESCRIPTION OF THE DRAWINGS

FIGS. 12b, 12c and 12d are cross-sectional views of three stages in the fabrication of the one embodiment of FIG. 12a.

FIGS. 20b–20e are cross-sectional views showing successive stages in the fabrication of a portion of the embodiment of FIG. 20a.

FIG. 21b is a detail plan view of the embodiment of FIG. 21a.

DESCRIPTION OF THE PREFERRED EMBODIMENTS

Figure 1:
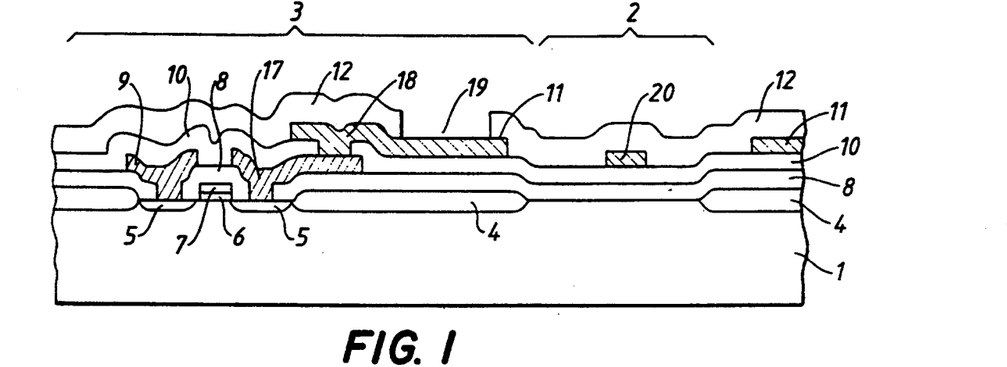
FIG. 1 is a cross-sectional view of the structure of a first embodiment of a semiconductor device.

FIG. 1 is a pictorial cross-sectional view of the structure of a first embodiment of a semiconductor device according to the present invention, in which a semiconductor IC wafer will be divided into chips in the same way as in the conventional semiconductor device shown in FIG. 2. In FIG. 1, the reference numerals 1 to 14 and 17 to 19 denote the same or like elements as those shown in FIG. 2, and a detailed description thereof will be omitted.

In FIG. 1, when the contact holes 17 are formed so as to bring the source and drain 5 and the first metal wiring 9 into contact with each other, by using a fine processing technique after the interlayer insulation film 8 is formed by CVD or the like, the interlayer insulation film 8 is left on the entire surface of the scribe line 2 by the provision of a resist pattern which prevents the interlayer insulation film 8 on scribe line 2 from being etched during etching of holes 17. Similarly, the subsequently applied interlayer insulation film 10 is left on the entire surface of the scribe line 2. As is clear from FIG. 1, by leaving the interlayer insulation films 8 and 10 on the entire surface of the scribe line 2, there is almost no difference in level between the chip area 3 and the scribe line area 2. Consequently, there is almost no difference in the thickness of a resist film (not shown in FIG. 1) between chip area 3 and scribe line area 2. Thus, it is possible to completely eliminate the problem of unexposed resist film which is caused by a thick resist film on the scribe line 2 in the conventional semiconductor device wafer shown in FIGS. 2-5.

In addition, since the passivation film 12 is also left on the entire surface of the scribe line 2, alignment marks 20 for the exposing apparatus are thoroughly protected during the step of etching the passivation film, thereby completely eliminating the problem of slip-off of the alignment mark, as explained with reference to FIG. 6.

The dicing step is carried out by a blade or the like (not shown) along the center of each scribe line 2. The scribe line areas having no alignment marks have the structure shown in FIG. 7, and the dicing step is carried out simultaneously without the need for the steps of removing the interlayer insulation films 8 and 10 and the passivation film 12 on the scribe lines 2. Thus, chips are separated and formed at a low cost.

Figure 8:
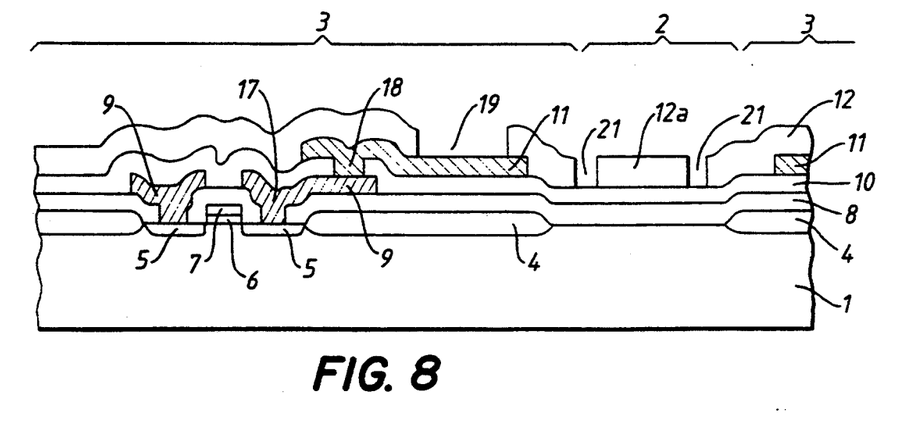
FIG. 8 is a cross-sectional view of a second embodiment of a semiconductor device disclosed in application Ser. No. 850,826.

FIG. 8 is a schematic sectional view of the structure of a second embodiment of a semiconductor device according to the present invention, in which a semiconductor element is formed into chips in the same way as in the first embodiment shown in FIG. 1. In FIG. 8, the reference numerals 1 to 14 and 17 to 19 denote the same or like elements as those shown in FIG. 1, and explanation thereof will be omitted.

When the contact holes 17 are formed so as to bring the source and drain 5 and the first metal wiring 9 into contact with each other, by using a fine processing technique after the interlayer insulation film 8 is formed by CVD or the like, the interlayer insulation film 8 is left on the entire surface of the scribe lines 2 by the provision of a suitable resist pattern (not shown) so as to prevent the interlayer insulation film 8 on lines 2 from being etched during etching of holes 17. Similarly, the interlayer insulation film 10 is left on the entire surface of scribe lines 2. When the bonding pad 19 is formed, the passivation film 12 on lines 2 is protected by a resist film (not shown) except for a slit region along the periphery of each chip. The slit regions are etched so as to form slit grooves 21. Etching of slit grooves 21 down to the upper surface of interlayer insulation film 10 serves to remove the passivation film 12 at the locations corresponding to the slit grooves 21. However, according to this embodiment, slit grooves 21 may or may not extend completely to interlayer insulation film 10. Namely, slit grooves 21 need only be deep enough so that after dicing chips 3 exhibit good humidity resistance, for reasons to be explained below. This feature is the same as in the embodiment 3, which will be described below. Consequently, a passivation film region 12a remains substantially only at the central portion of each scribe line 2 in the state of being effectively separated from the remaining passivation film 12. Dicing is carried out along the passivation film region 12a, as indicated by the arrow 22 in FIG. 9. Here, the slit grooves 21 desirably exist along both edges of the scribe line area. Depending on circumstances, even one slit grooves 21 has a good effect to improve the humidity resistance of the separated chips.

Figure 9:
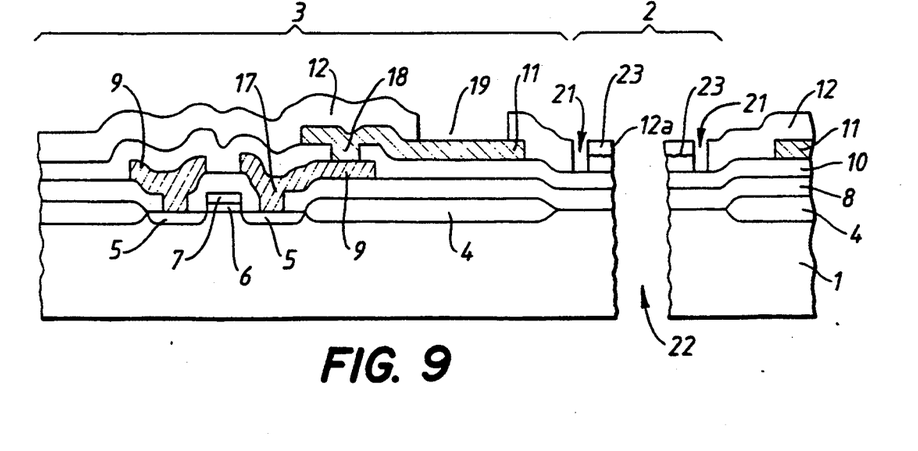
FIG. 9 is a cross-sectional view of the embodiment shown in FIG. 8 in the state in which a dicing step has been completed.

The second embodiment shown in FIG. 8 in the state in which dicing has been completed is shown in FIG. 9. Since a crack 23 normally produced during dicing is stopped by slit grooves 21, the crack 23 does not propagate beyond passivation film region 12a, thereby preventing the production of a crack in the passivation film 12. Thus, since such a crack would provide a moisture penetration path into a chip, chips 3 having a high resistance to moisture are obtained.

Figure 7:
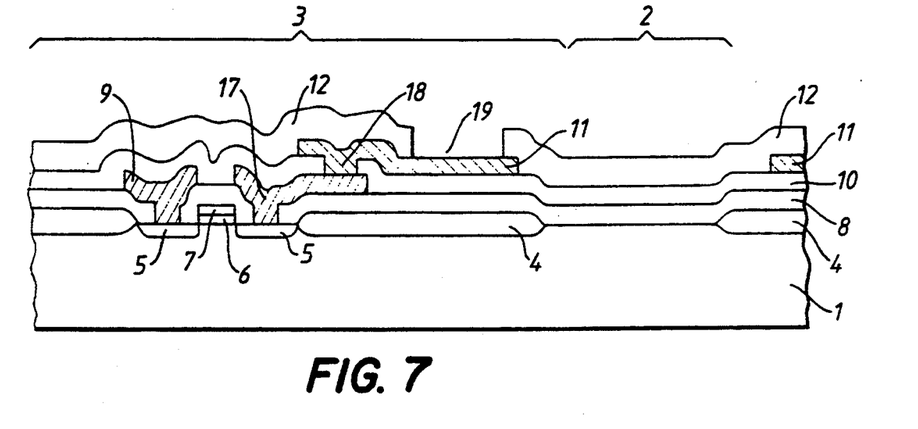
FIG. 7 is a cross-sectional view of a portion of the semiconductor device shown in FIG. 1 where no pattern is present on the scribe line.
Figure 10:
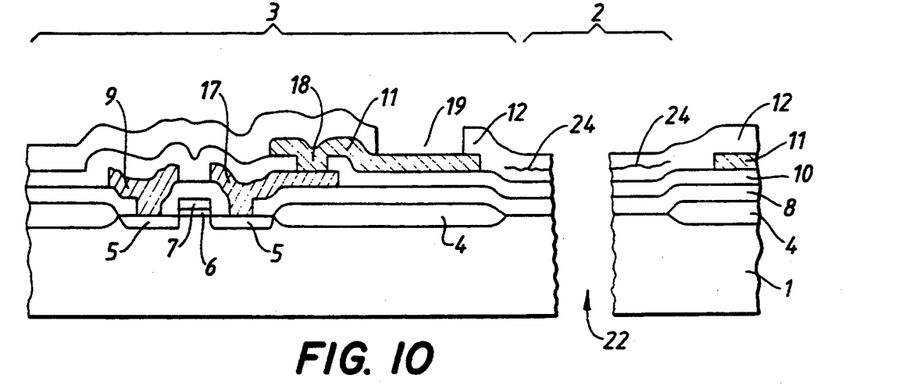
FIG. 10 is a cross-sectional view of the embodiment shown in FIGS. 1 and 7 in the state in which a dicing step has been completed.

This advantage of the second embodiment is not obtained when chips are diced along the scribe line 2 of the first embodiment (see FIG. 7). In the case in which the chips 3 are connected by the interlayer insulation films 8 and 10 and the passivation film 12 on the scribe line 2, as shown in FIG. 7, when dicing is carried out in the direction indicated by the arrow 22 of FIG. 10, a crack 24 is produced in the passivation film 12 at the edges of chips 3. If the crack 24 reaches the main part of a chip 3, it exerts a deleterious influence. From this point of view, the structure of the second embodiment shown in FIG. 8 can be said to have mainly achieved the improvement of not deteriorating resistance to moisture.

Figure 11:
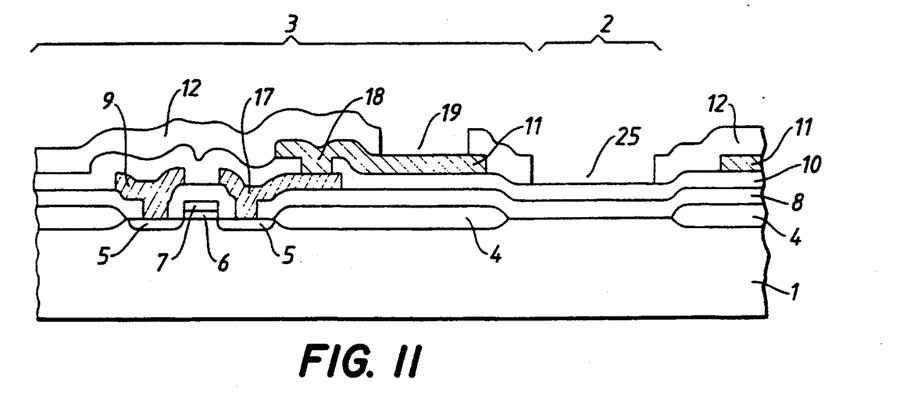
FIG. 11 is a cross-sectional view of a third embodiment of a semiconductor device disclosed in application Ser. No. 850,826.

FIG. 11 is a cross-sectional view of the structure of a third embodiment of a semiconductor device wafer according to the present invention, on which chips are fabricated in the same way as in the first embodiment shown in FIG. 1. In FIG. 11, the reference numerals 1 to 14 and 17 to 19 denote the same or like elements as those shown in FIG. 1, and explanation thereof will be omitted.

In FIG. 11, when contact holes 17 are formed so as to bring the source and drain 5 and the first metal wiring 9 into contact with each other, by using a fine processing technique after the interlayer insulation film 8 is formed by CVD or the like, the interlayer insulation film 8 is left on the entire surface of the scribe line 2 by the provision of a suitable resist pattern so as to prevent the interlayer insulation film 8 from being etched away from lines 2 during etching of holes 17. Similarly, the interlayer insulation film 10 is left on the entire surface of the scribe line 2. A part of the passivation film 12 on which no pattern such as an alignment mark (not shown) is formed is removed substantially completely during the step of forming bonding pad 19. As a result, since isolated passivation film regions having the form of passivation film region 12a of FIG. 8 remain on scribe lines 2 only at locations where there are alignment marks, interlayer insulation film 10 is exposed along a major part of each scribe line 2.

In this way, a comparatively wide slit 25 with the surface of the interlayer insulation film 10 exposed is formed at the central portion of each scribe line 2. In this case, a slit groove (not shown) such as that shown in the second embodiment is formed only at the locations where there is a pattern.

Since there is no passivation film region 12a shown in FIG. 8, when dicing is carried out along the slit 25 of the scribe line having the above-described structure, the load on the dicing blade (not shown) is reduced accordingly, so that the generation of cracks 24 on the passivation film 12 of the edges of chips 3 is prevented and the useful life of the blade is prolonged.

The semiconductor device wafer according to the first to third embodiments is an MOS-type semiconductor device with one layer of gate wiring and two layers of metal wiring. In these embodiments, the structure of the scribe lines is chiefly explained. The metal wiring may be replaced by a silicide wiring. That is, the present invention is applicable to any semiconductor device having at least one layer of wiring.

As described above, according to the present invention, since the interlayer insulation film and a part or most of the interlayer insulation film and the passivation film formed during the manufacturing process of a semiconductor device wafer are left on the scribe lines, the following advantages are produced.. According to the first aspect of the present invention, it is possible to provide a semiconductor device wafer having a stable yield and a high quality without increasing the number of manufacturing steps. According to the second aspect of the present invention, it is possible to provide semiconductor device chips having a stable resistance to moisture and a high reliability without increasing the number of manufacturing steps. Further, according to the third aspect of the present invention, it is possible to provide semiconductor device chips having an excellent resistance to moisture and capable of prolonging the useful life of a dicing blade without increasing the number of manufacturing steps.

FIGS. 12a–12d illustrate an embodiment which differs from that of FIG. 8 only in that the wafer is provided with a defined pattern 20a within a scribe line. Pattern 20a is formed, in an initial fabrication stage, as an irregularity in the surface of wafer 1. The irregularity is constituted by a change in elevation of the wafer surface.

As a result of the presence of the irregularity forming pattern 20a, this irregularity is repeated in overlying portions of interlayer insulation films 8 and 10 and passivation film 12. In the embodiment shown in FIG. 12a, passivation film 12 is provided with grooves 12a, as in FIGS. 8 and 9.

Figure 12A:
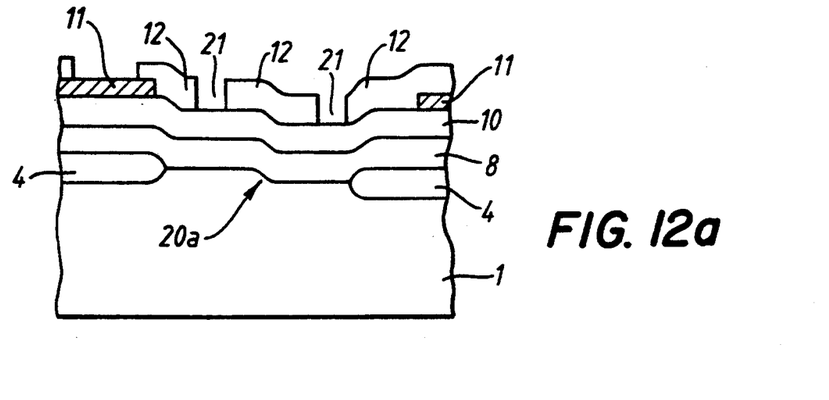
FIG. 12a is a cross-sectional view of a first embodiment of the present invention.
Figure 12B:
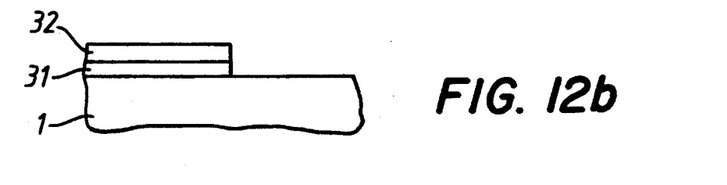
Figure 12C:
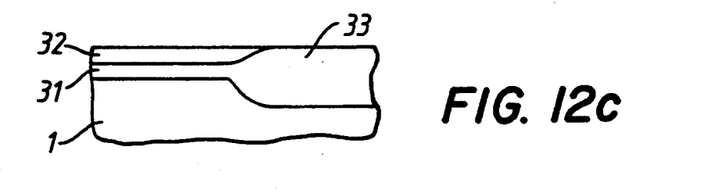
Figure 12D:
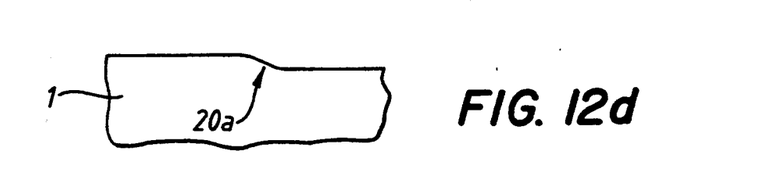

One advantageous manner of forming pattern 20a is shown in FIGS. 12b–12d. First, referring to FIG. 12b, the initially flat surface of substrate 1 is provided with a thin $SiO_2$ layer 31 and a $Si_3N_4$ masking layer 32, both patterned to expose the portion of substrate 1 where the substrate surface elevation is to be lowered.

Then, as shown in FIG. 12c, exposed parts of the surface of substrate 1 are subjected to oxidation to grow $SiO_2$ layer 33. During growth of such an oxide layer, a portion of that layer grows downwardly into the substrate surface. Therefore, when layers 31, 32 and 33 are removed, by any suitable etching technique, there is left the surface structure shown in FIG. 12d where the elevation of the surface of substrate 1 changes by a sufficient amount and with a sufficient slope to provide an observable pattern 20a.

Figure 13:
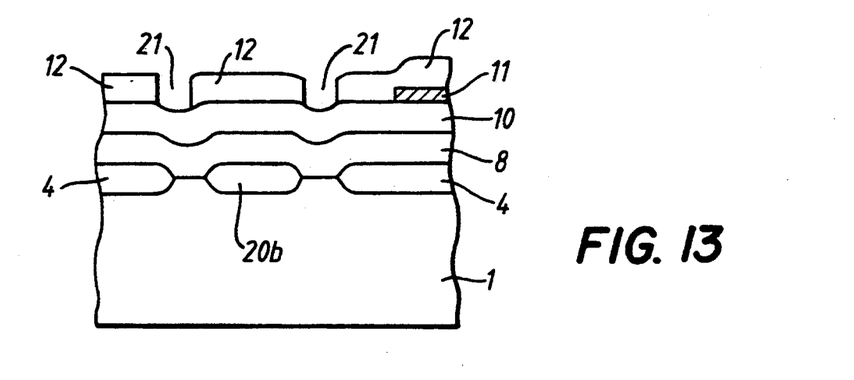
FIGS. 13, 14, 15, 16, 17, 18, 19, 20a and 21a are cross-sectional views of further embodiments of the invention.

In the embodiment shown in FIG. 13, the observable pattern is constituted by a portion 20b of insulating material formed simultaneously with device isolation insulating film 4. Hence portion 20b has the same composition as film 4. Otherwise, the embodiment of FIG. 13 is identical to that of FIG. 8.

Figure 14:
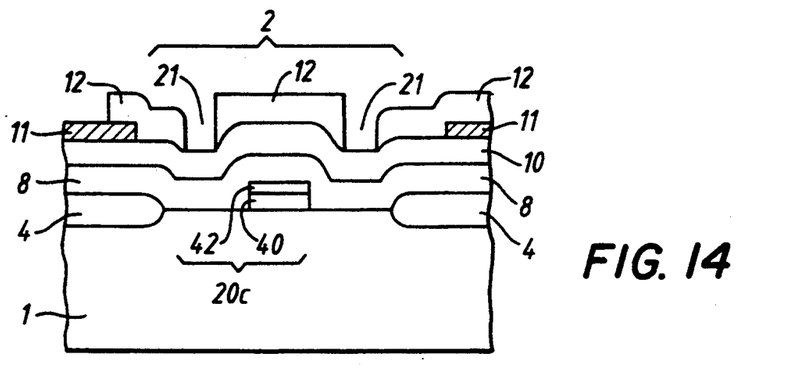

The embodiment shown in FIG. 14 differs from that of FIG. 8 in that a defined pattern 20c composed of superposed layer portions 40 and 42 is formed on substrate 1. Layer portion 40 may be made of $SiO_2$ and may be formed in the same step as gate insulating film 6 and layer portion 42 may be made of polysilicon or polycide and may be formed in the same step as gate electrode 7 in FIG. 7.

Figure 15:
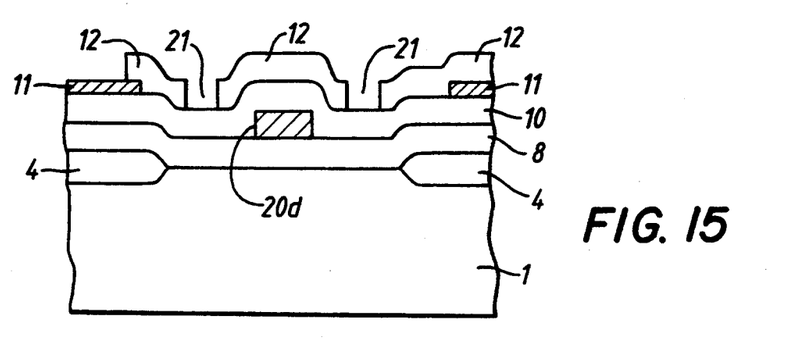

The embodiment of FIG. 15 differs from that of FIG. 8 in that a defined pattern 20d is formed on insulating film 8 as a layer portion made of Al, or Al-Si, or Al-Si-Cu, etc., formed in the same step as metal wiring 9 in FIG. 8.

Figure 16:
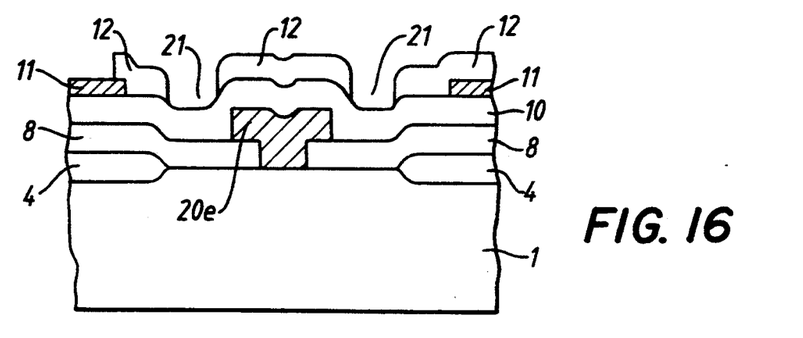

The embodiment of FIG. 16 differs from that of FIG. 8 in that a defined pattern 20e of Al, or Al-Si, or Al-Si-Cu, etc., is formed partly on substrate 1 and partly on layer 8 by creating an opening in insulating layer 8 and depositing conductive material partly in the opening and partly on layer 8 to form a T-shaped portion. The opening in layer 8 may be formed during the step for forming opening 17 in FIG. 8 and pattern 20e may be formed in the same step as metal wiring 9 in FIG. 8.

Figure 17:
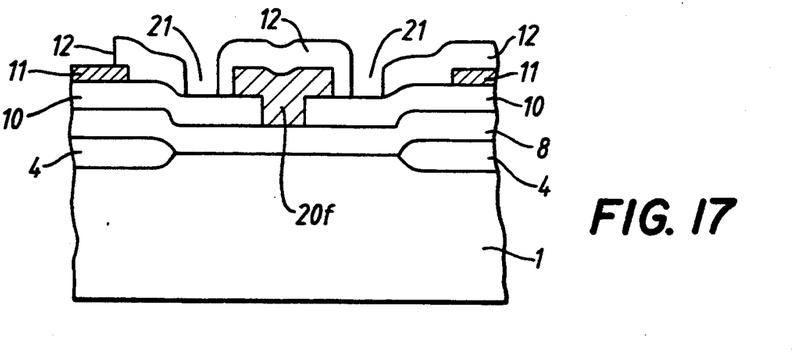

The embodiment of FIG. 17 differs from that of FIG. 8 in that a defined pattern 20f is formed partly on layer 8 and partly on layer 10 by creating an opening in layer 10 and then depositing a layer portion made of Al, or Al-Si, or Al-Si-Cu, etc., partly in the opening and partly on layer 10 to form a T-shaped portion. The opening in layer 10 may be formed during the step for forming opening 18 in FIG. 8 and pattern 20f may be formed in the same step as metal wiring 11 in FIG. 8.

According to various embodiments of the invention, a predetermined pattern or patterns as shown in any one of FIGS. 1 and 12–17 will be localized at one or more points along one or more scribe lines 2 of the wafer. In this case, passivation film 12 preferably has the form shown in one of FIGS. 1 and 12–17 in the or each region where a pattern is present, and passivation film 12 has the form shown in FIG. 11 in the or each region where no pattern is present. Of course, the passivation film structure of FIGS. 1 or 12–17 can extend somewhat beyond the associated pattern region or regions.

Figure 18:
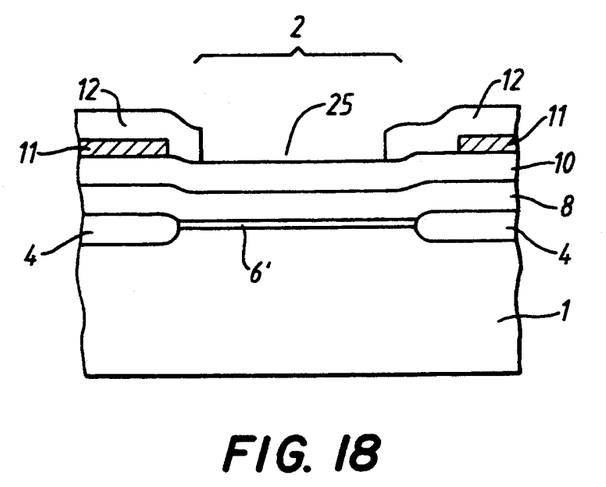

Pattern 20 a-f may be located at any one point along scribe lines 2, or at a plurality of points along scribe lines 2, or along the entire length of one or more scribe lines 2.In further accordance with the invention, as shown in FIG. 18, scribe lines 2 can be provided with insulating films 6' formed at the same time as, and hence having the same composition and thickness as, gate insulating films 6. With the exception of the insulating film 6' of FIG. 18, the structure of FIG. 18 is identical to that of FIG. 11. Thus, in the embodiment of FIG. 18, interlayer insulation film 8 is not in contact with substrate 1 at least along scribe lines 2.

Figure 19:
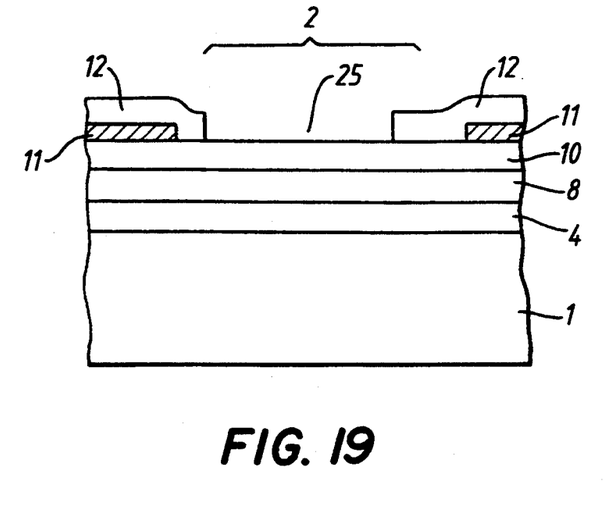

FIG. 19 illustrates an embodiment which differs from that of FIG. 18 in that in place of an insulating film formed together with gate insulating film 6, device isolation film 4 is extended across each scribe line 2. In structures of the type shown in FIG. 18, film 6' will be coextensive with all scribe lines 2. Similarly, in the case of structures having the form shown in FIG. 19, portions of film 4 will be coextensive with all scribe lines 2.

Figure 20A:
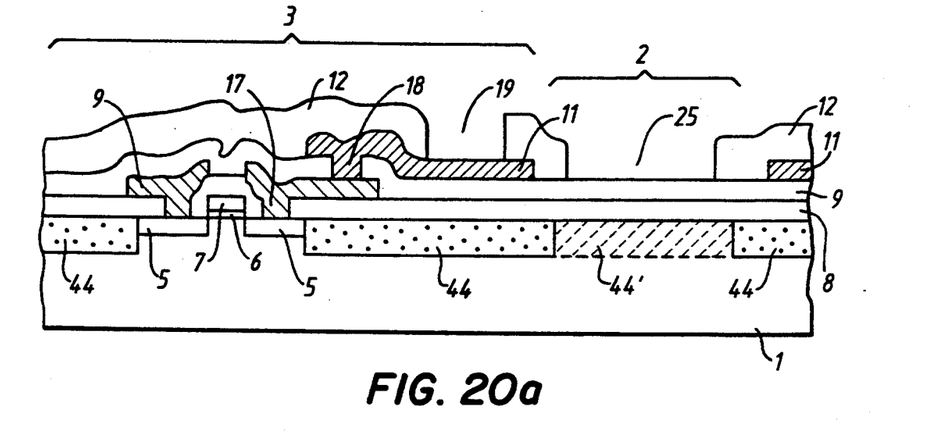

A further embodiment of a structure in accordance with the invention is shown in FIG. 20a which differs from that shown in FIG. 11 in that in place of film 4, there is provided trench type isolating portions 44. These are formed by subjecting substrate 1 to anisotropic etching to form trenches at the locations where such isolation is to be provided and then burying insulating material in the trenches.

In the embodiment shown in FIG. 20, the trench isolation may or may not extend beneath scribe lines 2. However, portions of trench isolation 44 can extend across scribe lines 2, in the same manner as shown in FIG. 19 with respect to film 4.

If the trench isolation does not extend beneath scribe lines 2, the trench isolation will consist of the portions 44 shown in solid lines in FIG. 20a. If the trench isolation additionally extends beneath scribe lines 2, the trench isolation will consist of portions 44 shown in solid lines and portions 44' one of which is shown in broken lines, in FIG. 20a. In the latter case, portions 44' will be formed simultaneously, and thus will be contiguous, with portions 44.

One suitable manner of forming trench isolation 44, 44' is depicted in FIGS. 20b–20e.

Figure 20B:
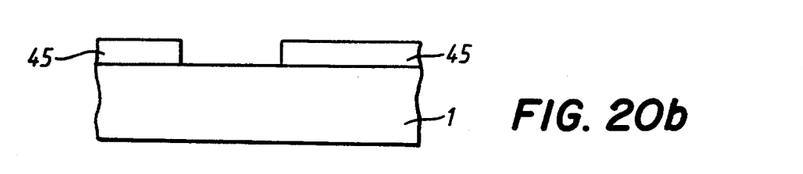

As shown in FIG. 20b, in an initial fabrication stage, before any doped regions have been formed in, or any layers have been formed on, substrate 1, a patterned photoresist layer 45 is formed on the initially flat surface of substrate 1. Layer 45 is provided with a window at each location where a buried trench type isolation portion is to be formed.

Figure 20C:
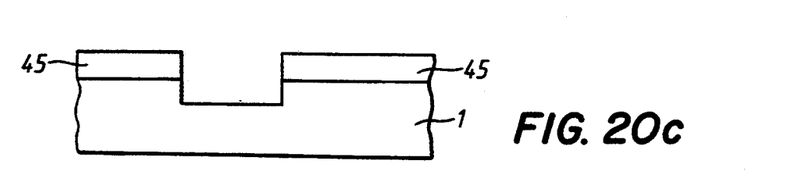

Then, as shown in FIG. 20c, an etching operation is performed to create a groove, or trench, in substrate 1 beneath each window in layer 45. A dry etching operation may be employed. After etching has been completed, layer 45 is removed.

Figure 20D:
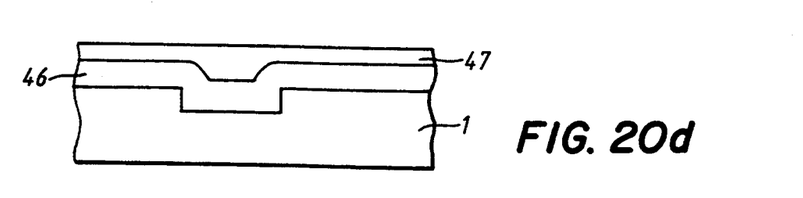
Figure 20E:
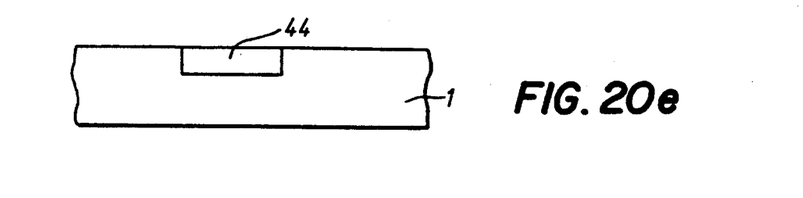

Thereafter, as shown in FIG. 20d, SiO$_2$ film 46 is deposited upon the entire surface of substrate 1, followed by a Spin-on-Glass (SOG) film 47. Then, a dry etching process is performed with a dry etching gas which will etch films 46 and 47 at the same rate. Film 47 corrects for the uneven height of film 46 and has a planar upper surface. Therefore, the combined layer formed by films 46 and 47 will be etched to a uniform depth down to the original planar surface of substrate 1, leaving isolated SiO$_2$ film portions 44 (and 44') as shown in FIG. 20e.

Embodiments of the invention may have any one or any combination of patterns 20a–20f at one or more locations along one or more scribe lines 2, with passivation film 12 having the form shown in any one of FIGS. 1 and 12–17 at the location of each pattern and the form shown in FIGS. 11 and 18–20 where no defined pattern is present. An insulation film such as film 6' in FIG. 18, film 4 in FIG. 19, or film 44 in FIG. 20 may be disposed on the surface of wafer 1 along the entirety of each scribe line 2.

In the case of the embodiment of FIGS. 12, film 4 would be deposited after fabrication of pattern or patterns 20a.

Figure 21A:
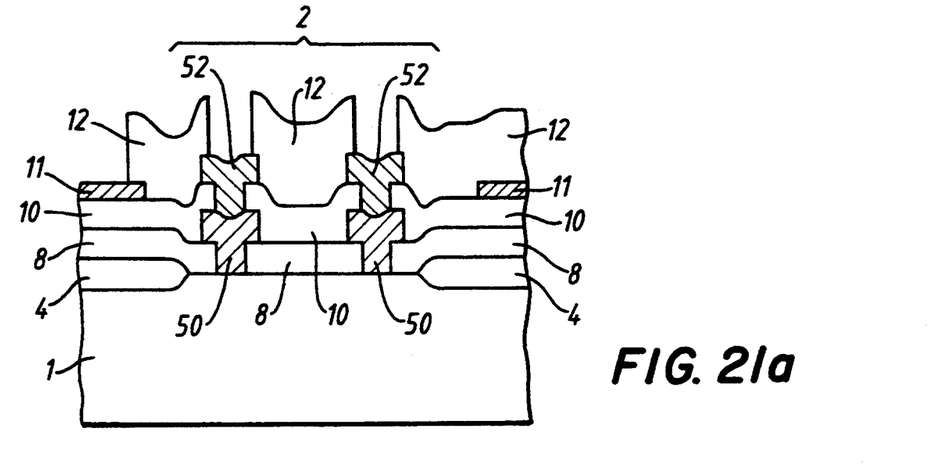
Figure 21B:
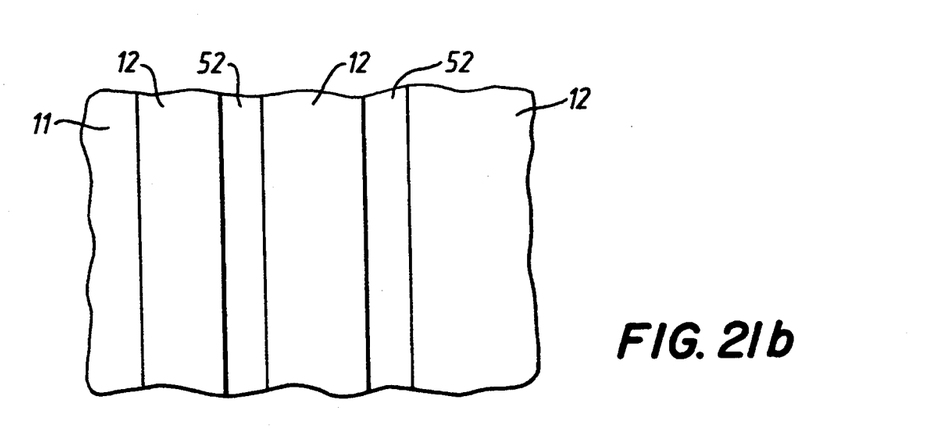

FIGS. 21a and b illustrate another embodiment of the invention in which conductive strips 50 and 52 are provided along the edges of scribe lines 2, where they will serve to prevent the formation of short circuits in an IC if a conductive alignment, or test, pattern originally formed on scribe line 2 should be broken off. If this should occur, the broken off part would adhere to one of the conductive strips 50, 52, which are themselves electrically isolated from the chip IC's.

Strips 50 may be formed in the same manner as pattern elements 20e of FIG. 16, while strips 52 may be formed in the same manner as pattern element 20f of FIG. 17.

Preferably, strips 50, 52 will extend along the entire length of every scribe line 2, or, in other words, will extend around the entire periphery of each chip. Of course, if only one or more sides of each chip requires such protection, strips 50, 52 may be disposed accordingly.

The portions of passivation film 12 covering scribe lines 2 are provided with slit grooves 21 along the scribe line edges. Grooves 21 extend down to strips 52.

Figure 21C:
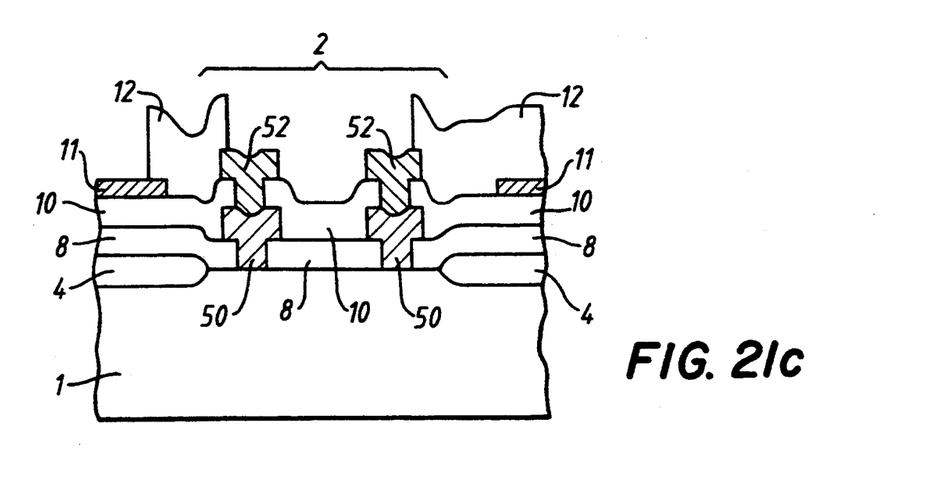
FIGS. 21c–21e are cross-sectional views of modified versions the embodiment of FIGS. 21a and 21b.

A first modified version of the above-described embodiment is shown in FIG. 21c. This embodiment differs from that of FIGS. 21a and b in that passivation film 12 does not cover scribe lines 2, although film 12 does cover a part of each strip 52, as in FIGS. 21a and b.

Figure 21D:
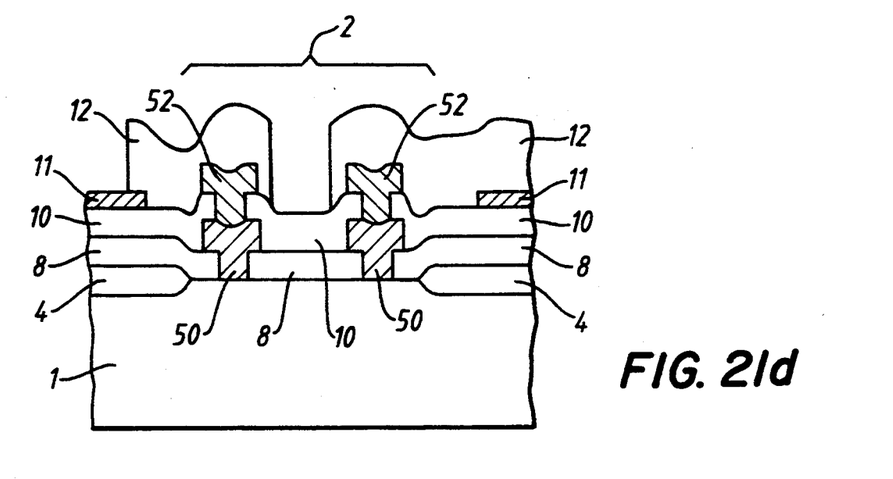

In a second modified version of the above-described embodiment, shown in FIG. 21d, passivation film 12 completely covers strips 52 but does not extend across scribe lines 2.

Figure 21E:
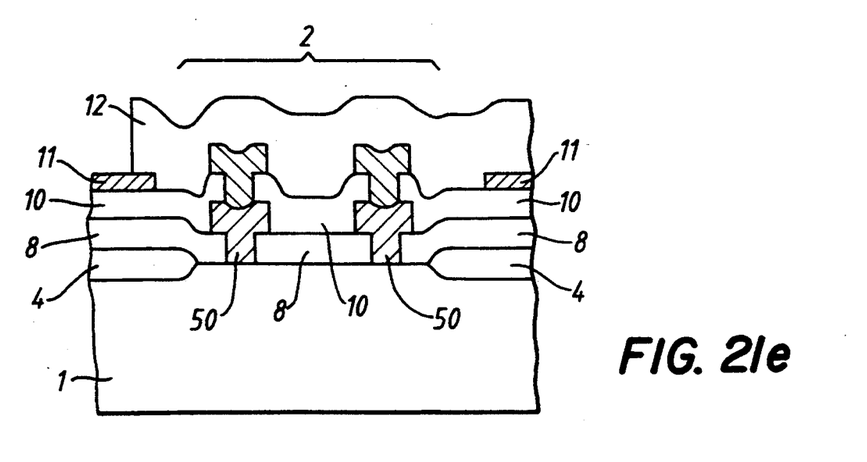

In a third modified version of the above-described embodiment, shown in FIG. 21e, passivation film 12 extends continuously across scribe lines 2.

The protective structures shown in FIGS. 21 may be employed with any of the defined pattern structures of FIGS. 1 and 12–17, where passivation film 12 will cover scribe line 2 wherever a defined pattern exists and will have grooves 21 over strip 52.

The embodiments of FIGS. 21 may be modified by addition of film 6', 4 or 44 as shown in FIGS. 18, 19 and 20.

This application relates to subject matter disclosed in Japanese Patent Applications Nos. 94124/89, filed Apr. 13, 1989, 124741/89, filed May 18, 1989, and 432/90, filed Jan. 8, 1990, the disclosure of which is incorporated herein by reference.

While there has been described what are at present considered to be preferred embodiments of the invention, it will be understood that various modifications may be made thereto, and it is intended that the appended claims cover all such modifications as fall within the true spirit and scope of the invention.

The presently disclosed embodiments are therefore to be considered in all respects as illustrative and not restrictive, the scope of the invention being indicated by the appended claims, rather than the foregoing description, and all changes which come within the meaning and range of equivalency of the claims are therefore intended to be embraced therein.

What is claimed:

1. An integrated circuit wafer comprising a substrate having a surface carrying a plurality of circuit chips spaced from one another by scribe lines constituted by regions of the substrate surface along which the substrate will be cut in order to separate the chips from one another, each scribe line having two longitudinal edges, wherein each chip has at least one semiconductor element composed of a plurality of patterned layers of electrically conductive material and said wafer comprises at least one interlayer insulation film having portions which extend across each said chip and interposed between two of said layers of electrically conductive material to form a component part of each said element, said interlayer insulation film further having portions which extend across the entirety of said scribe lines at the time said substrate is cut along said scribe lines and which are contiguous with portions of said interlayer insulation film that extend across each said chip, and said substrate surface has an observable irregularity constituting a defined pattern located at a scribe line region and spaced inwardly of said two longitudinal edges.

2. A wafer as defined in claim 1 wherein said substrate has at least two observable irregularities each constituting a defined pattern, each defined pattern being located at a respective scribe line region and the respective scribe line regions being spaced from one another by an intervening scribe line region where no defined pattern is present.

3. A wafer as defined in claim 1 further comprising a layer of insulating material formed at said substrate surface, extending across said scribe lines and interposed between said substrate surface and said interlayer insulation film.

4. A wafer as defined in claim 3 wherein said substrate is made of silicon and said layer of insulating material is formed by oxidizing silicon of the substrate.

5. A wafer as defined in claim 3 wherein said substrate is provided with trenches beneath each scribe line and said layer of insulating material is constituted by insulating material deposited in said trenches.

6. An integrated circuit wafer comprising a substrate having a surface carrying a plurality of circuit chips spaced from one another by scribe lines constituted by regions of the substrate surface along which the substrate will be cut in order to separate the chips from one another, each scribe line having two longitudinal edges, wherein each chip has at least one semiconductor element composed of a plurality of patterned layers of electrically conductive material and said wafer comprises an interlayer insulation film having an upper surface and having portions which extend across each said chip and are interposed between two of said layers of electrically conductive material to form a component part of each said element, said interlayer insulation film further having portions which extend across the entirety of said scribe lines at the time said substrate is cut along said scribe lines and which are contiguous with portions of said interlayer insulation film that extend across each said chip, and said wafer further comprises a film having a defined pattern located at at least one scribe line region, disposed at least partially below the upper surface of said interlayer insulation film and spaced inwardly of said two longitudinal edges.

7. A wafer as defined in claim 6 wherein said film having a defined pattern is constituted by two film portions each having a defined pattern and spaced from one another by a scribe line region where no defined pattern is present.

8. A wafer as defined in claim 7 further comprising a patterned layer of insulating material formed on said substrate surface for isolating semiconductor elements from one another, wherein each said film portion having a defined pattern is constituted by a respective discrete portion of said patterned layer of insulating material.

9. A wafer as defined in claim 7 wherein each said film portion having a defined pattern is made of an electrically conductive material and said wafer further comprises a passivation film covering said chips and the each scribe line region where a respective film portion is present, said passivation film having, at each scribe line region where a respective film portion is present, at least one groove formed along at least one edge of the scribe line, and said passivation film being absent from scribe line regions where said defined pattern portions are not present.

10. A wafer as defined in claim 7 wherein each said film portion having a defined pattern is composed of a first layer of insulating material formed on said substrate surface and a second layer of a material selected from a group comprising of polysilicon and polycide material formed on said first layer.

11. A wafer as defined in claim 7 further comprising a second insulation film disposed between said substrate surface and said interlayer insulation film and having portions which extend across said scribe lines, and wherein each said film portion having a defined pattern is disposed at least partially between said interlayer insulation film and said second insulation film.

12. A wafer as defined in claim 11 wherein, at the location of each said film portion having a defined pattern, said second insulation film has a hole into which the respective film portion having a defined pattern extends.

13. A wafer as defined in claim 7 further comprising a second insulation film disposed between said substrate surface and said interlayer insulation film and having portions which extend across said scribe lines, and wherein, at the location of each said film portion having a defined pattern, said interlayer insulation film is provided with a hole, and the respective film portion having a defined pattern is disposed partly in the hole and partly on said interlayer insulation film.

14. A wafer as defined in claim 7 further comprising a layer of insulating material formed at said substrate surface, extending across said scribe lines and interposed between said substrate surface and said interlayer insulation film.

15. A wafer as defined in claim 14 wherein said substrate is made of silicon and said layer of insulating material is formed by oxidizing silicon of the substrate.

16. A wafer as defined in claim 14 wherein said substrate is provided with trenches beneath each scribe line and said layer of insulating material is constituted by insulating material deposited in said trenches.

17. A wafer as defined in claim 6 wherein said film having a defined pattern is made of an electrically conductive material and said wafer further comprises a passivation film covering said chips and the scribe line region at which the film having a defined pattern is present, said passivation film having, at the scribe line region where the film having a defined pattern is present, at least one groove formed along at least one edge of the scribe line, and said passivation film being absent from scribe line regions where there is no film having a defined pattern.

18. A wafer as defined in claim 6 further comprising a patterned film of insulating material formed on said substrate surface for isolating semiconductor elements from one another, wherein said film having a defined pattern is constituted by a discrete portion of said patterned film of insulating material.

19. A wafer as defined in claim 6 wherein said film having a defined pattern is composed of a first layer of insulating material formed on said substrate surface and a second layer of a material selected from a group comprising of polysilicon and polycide material formed on said first layer.

20. A wafer as defined in claim 6 further comprising a second insulation film disposed between said substrate surface and said interlayer insulation film and having portions which extend across said scribe lines, and wherein said film having a defined pattern is disposed at least partially between said interlayer insulation film and said second insulation film.

21. A wafer as defined in claim 20 wherein, at the location of said film having a defined pattern, said second insulation film has a hole into which said film portion having a defined pattern extends.

22. A wafer as defined in claim 6 further comprising a second insulation film disposed between said substrate surface and said interlayer insulation film and having portions which extend across said scribe lines, and wherein, at the location of said film having a defined pattern, said interlayer insulation film is provided with a hole, and said film portion having a defined pattern is disposed partly in the hole and partly on said interlayer insulation film.

23. A wafer as defined in claim 6 further comprising a layer of insulating material formed at said substrate surface, extending across said scribe lines and interposed between said substrate surface and said interlayer insulation film.

24. A wafer as defined in claim 23 wherein said substrate is made of silicon and said layer of insulating material is formed by oxidizing silicon of the substrate.

25. A wafer as defined in claim 23 wherein said substrate is provided with trenches beneath each scribe line and said layer of insulating material is constituted by insulating material deposited in said trenches.

26. An integrated circuit wafer comprising a substrate having a surface carrying a plurality of circuit chips spaced from one another by scribe lines constituted by regions of the substrate surface along which the substrate will be cut in order to separate the chips from one another, wherein each chip has at least one semiconductor element composed of a plurality of patterned layers of electrically conductive material and said wafer comprises at least one interlayer insulation film having portions which extend across each said chip and interposed between two of said layers of electrically conductive material to form a component part of each said element, said interlayer insulation film further having portions which extend across the entirety of said scribe lines and which are contiguous with portions of said interlayer insulation film that extend across each said chip, and said wafer further comprises a thermally grown film of insulating material formed at said substrate surface, extending across said scribe lines and interposed between said substrate- surface and said interlayer insulation film.

27. An integrated circuit wafer comprising a substrate having a surface carrying a plurality of circuit chips spaced from one another by scribe lines constituted by regions of the substrate surface along which the substrate will be cut in order to separate the chips from one another, each scribe line having two longitudinal edges, wherein each chip has at least one semiconductor element composed of a plurality of patterned layers of electrically conductive material and said wafer comprises at least one interlayer insulation film having portions which extend across each said chip and interposed between two of said layers of electrically conductive material to form a component part of each said element, said interlayer insulation film further having portions which extend across the entirety of said scribe lines and which are contiguous with portions of said interlayer insulation film that extend across each said chip, and said wafer further comprises a layer of insulating material formed at said substrate surface in a pattern for isolating semiconductor elements from one another, said layer of insulating material extending across said scribe lines and being interposed between said substrate surface and said interlayer insulation film.

28. A wafer as defined in claim 27 wherein said substrate is made of silicon and said layer of insulating material is formed by oxidizing silicon of the substrate.

29. A wafer as defined in claim 27 wherein said substrate is made of silicon and is provided in its surface with a trench in a pattern corresponding to the pattern of said layer of insulating material, and said layer of insulating material is constituted by insulating material deposited in said trenches.

30. An integrated circuit wafer comprising a substrate having a surface carrying a plurality of circuit chips spaced from one another by scribe lines constituted by regions of the substrate surface along which the substrate will be cut in order to separate the chips from one another, each scribe line having two longitudinal edges and a central portion between said longitudinal edges, wherein each chip has at least one semiconductor element composed of a plurality of patterned layers of electrically conductive material and said wafer comprises at least one interlayer insulation film having portions which extend across each said chip and interposed between two of said layers of electrically conductive material to form a component part of each said element, said interlayer insulation film further having portions which each extend across the central portion of a respective scribe line at the time said substrate is cut along said scribe lines and said interlayer insulation film further having a groove extending along each of said longitudinal edges for separating said portions of said interlayer insulation film which extend across said central portions of said scribe lines from portions of said interlayer insulation film that extend across each said chip, and said wafer further comprises a strip of electrically conductive material filling each said groove and extending over a region of said interlayer insulation film adjacent each said groove.

31. A wafer as defined in claim 30 wherein there are two said interlayer insulation films disposed atop one another, there is a said strip of electrically conductive material associated with each said groove in each said interlayer insulation film, and, along each said longitudinal edge, said strips associated with one of said interlayer insulation films contact said strips associated with the other one of said interlayer insulation films.

32. A wafer as defined in claim 31 further comprising a film of electrically conductive material having a defined pattern located at at least one scribe line region between said longitudinal edges.

33. A wafer as defined in claim 30 further comprising a film of electrically conductive material having a defined pattern located at at least one scribe line region between said longitudinal edges.

* * * * *